US012588312B2

(12) United States Patent (10) Patent No.: US 12,588,312 B2
Voltan et al. (45) Date of Patent: Mar. 24, 2026

(54) METHOD AND APPARATUS FOR PRINTING ON A SUBSTRATE FOR THE PRODUCTION OF A SOLAR CELL

(71) Applicant: APPLIED MATERIALS ITALIA S.R.L., San Biagio di Callalta (IT)

(72) Inventors: Alessandro Voltan, Morgano (IT); Marco Galiazzo, Quinto di Treviso (IT); Oscar Borsato, Padernello (IT); Davide Colla, Treviso (IT)

(73) Assignee: APPLIED MATERIALS ITALIA S.R.L., San Biagio di Callalta (IT)

( * ) Notice: Subject to any disclaimer, the term of this patent is extended or adjusted under 35 U.S.C. 154(b) by 787 days.

(21) Appl. No.: 17/788,203

(22) PCT Filed: Mar. 21, 2021

(86) PCT No.: PCT/EP2021/056382
    § 371 (c)(1),
    (2) Date: Jun. 22, 2022

(87) PCT Pub. No.: WO2022/188995
    PCT Pub. Date: Sep. 15, 2022

(65) Prior Publication Data
    US 2024/0170604 A1     May 23, 2024

(51) Int. Cl.
    H10F 71/00        (2025.01)
    B41F 15/14        (2006.01)
    (Continued)

(52) U.S. Cl.
    CPC .............. H10F 71/00 (2025.01); B41F 15/14 (2013.01); B41M 1/12 (2013.01); H10F 77/211 (2025.01);
    (Continued)

(58) Field of Classification Search
    CPC .............................. H10F 71/00; H10F 77/211
    See application file for complete search history.

(56) References Cited

U.S. PATENT DOCUMENTS 9,991,412 B2 * 6/2018 Gonzalez ............ H10F 71/1375
2010/0184244 A1 * 7/2010 Hunt ..................... H10F 77/211
                                                        438/57
(Continued)

FOREIGN PATENT DOCUMENTS

CN       102602183 B  *  5/2014
CN       105762205 A  *  7/2016    ..... H01L 31/022425
(Continued)

OTHER PUBLICATIONS

International Search Report and Written Opinion, PCT/EP2021/056382, Nov. 24, 2021.
(Continued)

*Primary Examiner* — Edward Chin
(74) *Attorney, Agent, or Firm* — Patterson + Sheridan, LLP

(57) ABSTRACT

A method (500) for printing on a substrate (102) for the production of a solar cell, the method comprising: printing (501) a wet pattern on the substrate (102); extracting (503) three-dimensional morphological data of the wet pattern (104') in real-time using an in-line profilometer (101); wherein the printing of the wet pattern on the substrate is controlled in real time at least in part based on previous three-dimensional morphological data obtained by extracting the three-dimensional morphological data.

19 Claims, 9 Drawing Sheets

(51) Int. Cl.
    *B41M 1/12*           (2006.01)
    *H10F 77/20*        (2025.01)

(52) U.S. Cl.
    CPC ....... *B41P 2200/40* (2013.01); *B41P 2215/50* (2013.01)

(56) References Cited

U.S. PATENT DOCUMENTS

| | | | | |
|---|---|---|---|---|
| 2012/0261625 | A1* | 10/2012 | Chiu | C08K 5/09 252/182.13 |
| 2012/0285503 | A1* | 11/2012 | Yoshimine | H10F 19/906 438/66 |
| 2014/0124713 | A1* | 5/2014 | Majumdar | H01B 1/22 252/514 |
| 2016/0163912 | A1* | 6/2016 | Gonzalez | H10F 71/1375 118/712 |
| 2016/0167396 | A1 | 6/2016 | Chang | |
| 2018/0333911 | A1* | 11/2018 | Lin | B29C 64/165 |
| 2019/0352430 | A1* | 11/2019 | Demirel | C30B 7/14 |
| 2020/0147966 | A1* | 5/2020 | Bertoni | B41J 2/1607 |
| 2021/0353010 | A1* | 11/2021 | Harnett | B81B 1/006 |
| 2021/0376282 | A1* | 12/2021 | Chang | H10K 59/80524 |

FOREIGN PATENT DOCUMENTS

| | | | | | |
|---|---|---|---|---|---|
| CN | 206765532 | U | * | 12/2017 | |
| CN | 110931594 | A | * | 3/2020 | |
| CN | 111180529 | A | | 5/2020 | |
| CN | 111566148 | A | * | 8/2020 | B32B 3/30 |
| JP | 2020510739 | A | * | 4/2020 | |
| WO | WO-2012135551 | A1 | * | 10/2012 | H01B 1/02 |
| WO | WO-2015163570 | A1 | * | 10/2015 | B22F 1/16 |
| WO | 2016/040453 | A1 | | 3/2016 | |
| WO | 2018/213356 | A1 | | 11/2018 | |

OTHER PUBLICATIONS

Chinese Notice of Allowance dated Jul. 23, 2025 for Application No. 202180007149.0, 4 pages.

* cited by examiner

300

402

404

400

500

METHOD AND APPARATUS FOR PRINTING ON A SUBSTRATE FOR THE PRODUCTION OF A SOLAR CELL

FIELD

Embodiments of the present disclosure relate to methods for printing on a substrate for the production of a solar cell, a method for optimization of material consumption during production of a solar cell, and to apparatuses for printing on a substrate for the production of a solar cell.

BACKGROUND

Solar cells are photovoltaic devices that convert electromagnetic energy in the form of incident light into electric energy.

Photons of the light impact on a semi-conducting material, e.g. a p-doped semiconducting material, of the solar cell and energize electrons of the semi-conducting material. If the photon incident on the solar cell has sufficient energy, an electron-hole pair is generated within the solar cell with the electron passing through an energy band gap of the semi-conducting material and reaching a conduction band energy level. The electron may then flow towards an n-doped semiconducting material of the solar cell while remaining in the conduction band; flowing towards a first metal contact forming a negative electrode of the solar cell in contact with the n-doped semiconducting material. Similarly, the electron-hole may move through the p-doped semiconducting material towards a second metal contact forming a positive electrode of the solar cell in contact with the p-doped semiconducting material.

The first metal contact and the second metal contact are on opposite surfaces of the solar cell and a DC electric potential difference is generated between the metal contacts when light shines onto the solar cell. Closing the circuit, a DC electric current flows with the solar cell acting as an electric generator, converting the energy of the light into electric energy.

The first metal contact forming the negative electrode in contact with the n-doped semiconducting material is formed by a thin layer of conductive material forming a finger of the solar cell. The finger only covers a portion of the surface in order not to hinder the incidence of the photons into the solar cell material and into the semiconducting material of the solar cell. Multiple solar cells are typically connected in parallel and/or in series in order to provide a higher current and/or voltage.

Busbars are bars of conductive material connected to one or more fingers of the solar cell and designed to collect the electric current from the one or more fingers and to guide said current towards an electric circuit coupled to a load that receives the electric energy generated from the solar cell.

The fingers therefore are thin metallic conductors that collect the generated DC current delivering said current to the busbars that deliver it towards the load.

Busbars and fingers are printed on the surface of the semiconducting material of the solar cell using screen printing and are made of a high conductivity material like for example silver paste.

To measure the amount of paste applied to a substrate of the solar cell typically a double weighing is carried out before and after the printing process.

It is beneficial to optimize the paste laydown.

SUMMARY

According to an aspect, the present disclosure provides a method for printing on a substrate for the production of a solar cell, the method comprising:

printing a wet pattern on the substrate;

extracting three-dimensional morphological data of the wet pattern in real-time using an in-line profilometer;

wherein the printing of the wet pattern on the substrate is controlled in real time at least in part based on previous three-dimensional morphological data obtained by extracting the three-dimensional morphological data.

According to a further aspect, the present disclosure provides a method for optimization of material consumption during production of a solar cell, the method comprising:

printing on a substrate 102 for the production of the solar cell according to the method of any of claims from 1 to 9;

determining a material consumption based on the extracted three-dimensional morphological data;

optimizing the material consumption;

wherein the material consumption is a consumption of a material used for printing the wet pattern on the substrate.

According to a further aspect, the present disclosure provides an apparatus for printing on a substrate for the production of a solar cell, the apparatus comprising:

a substrate holder;

an in-line profilometer;

an actuator coupled to the substrata holder;

a printer for applying a wet pattern on the substrate;

a controller coupled to the in-line profilometer and the actuator and the printer and configured to control a printing of the wet pattern on the substrate;

wherein the in-line profilometer is configured to extract three-dimensional morphological data of the wet pattern on the substrate placed on the substrate holder in real-time.

DETAILED DESCRIPTION OF EMBODIMENTS

The present disclosure provides methods and systems that involve a laser system to do an in-line real-time 3D scanning of the printed fingers and busbars.

The application extracts 3d morphology data in real-time on wet-printed fingers and busbars. The data can be used to improve the real-time control on the printing process.

The monitoring of the paste laydown is an important index for the cell efficiency in the production of solar cells.

The present disclosure allows to overcome the limitations of a manual measure of the paste laydown carried out off-line at the expense of operator time and also allows to overcome the limitations of automatic measurements that can be carried out only with low frequency, e.g. based on double weighing.

Some embodiments of the present disclosure may estimate the paste laydown using the measurement of a portion of the 3D finger morphology of each printed cell. Therefore, it may be possible to monitor the deviations in real-time along the complete production. A process control with an improved accuracy is provided.

Traditionally the control of the paste deposit during production is done by sampling, which is either done manually by an operator or by in-line scales that perform the operation automatically at low frequency.

Embodiments of the present disclosure relate to the use of metrology for indirect evaluation of the laydown of the wet paste, e.g. with the use of a 3D laser profilometer.

The present disclosure makes it possible to monitor the complete production and enables real-time process control. The present application improves the production efficiency by eliminating the double weighing off-line of a cell before and after the print done manually by the operator, e.g. done every 4 hours, and improves the system yield by real-time feedback.

The present application may be suitable for integration with Industry 4.0 increasing the synergy for data processing.

Systems according to the present disclosure may include a multiple-head 3D laser and controller interfaced with the processing line, e.g. through ethernet.

While the 3D laser head is kept fixed, the wafer under measurement may move under the 3D profilometer and the printed layout is scanned in the advancement direction.

Beside the estimation of paste laydown, the 3D laser profilometer may be used to monitor finger and busbar morphology, preventing loss of printing quality and soldering issues on busbars.

Paste laydown may be calculated using the measured printed volume by dedicated algorithms.

Figure 1:
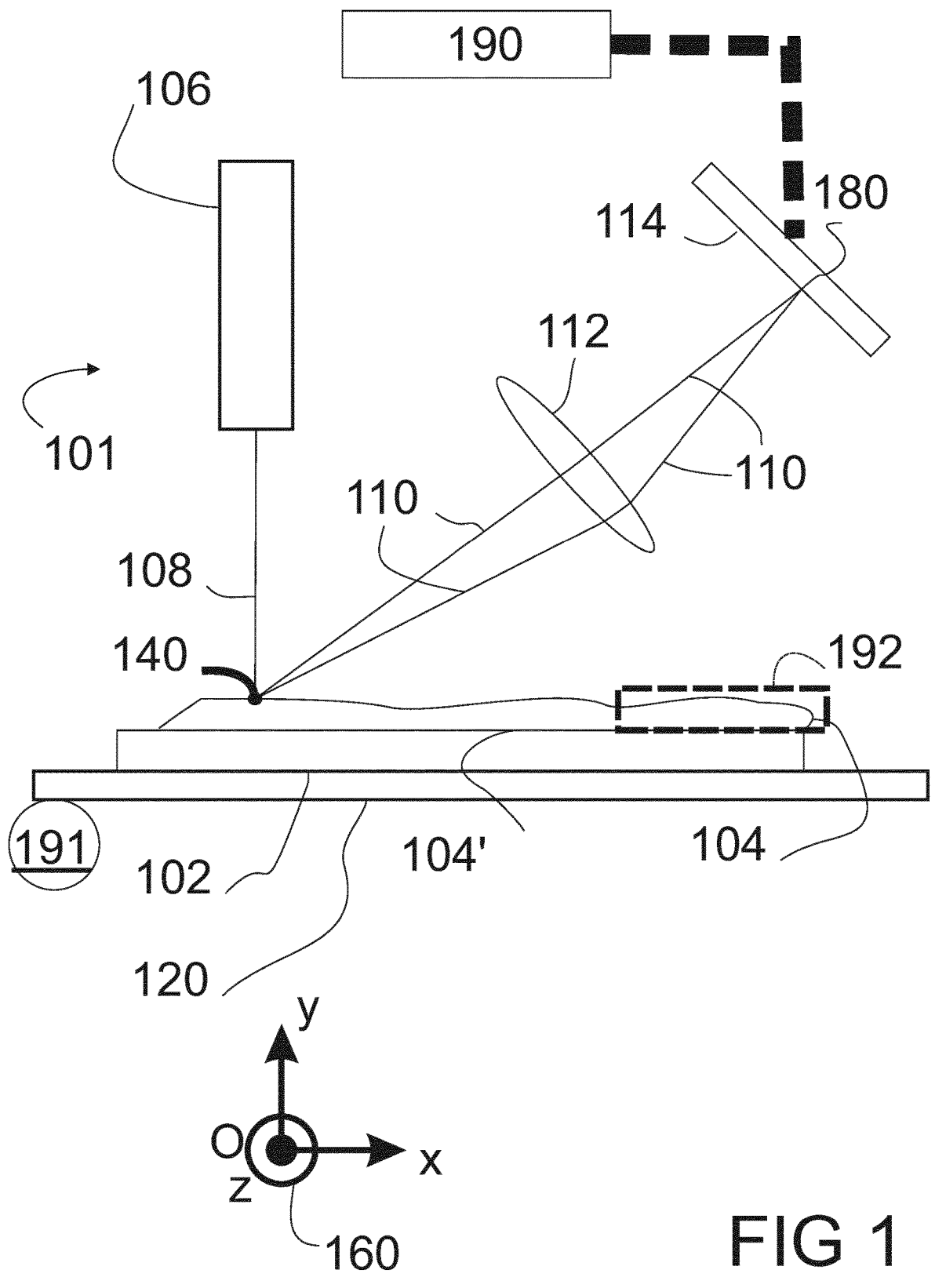
FIG. 1 shows details related to embodiments of methods and apparatuses of the present disclosure.

FIG. 1 shows details related to embodiments of methods and apparatuses of the present disclosure.

A conductive paste 104 is placed on top of a substrate 102 placed on a substrate holder 120. The conductive paste 104 may be applied on the substrate 102 e.g. with the use of a screen (not shown in the figure) in order to obtain a wet pattern 104' on top of the substrate 102.

The substrate 102 may in particular be made of semiconductor material, for example with an n-doped semiconductor material in an upper portion of the substrate 102, i.e. a portion extending in the y direction according to the coordinate system 160 and for example with a p-doped semiconductor material extending towards the opposite bottom surface, i.e. the surface of the substrate 102 facing the substrate holder 104 and extending towards the –y direction according to the coordinate system 160.

The conductive paste 104 is used to create a wet pattern 104', e.g. with the use of a screen, on top of the substrate 102, for example a finger or a busbar of the solar cell.

A laser system 106 is configured to generate a two-dimensional light beam 108 incident on the conductive paste 104 on at least one incidence segment 140.

In some embodiments, the two-dimensional light beam 108 and the segment 140 extend for example parallel to an Ozy plane as indicated for example by the Cartesian coordinate system 160 of FIG. 1 while the wet conductive paste 104 extends mainly in a perpendicular direction parallel to the x axis of the coordinate system 160. The origin of the Cartesian coordinate system 160 Oxyz is indicated with O.

In other embodiments, the pattern 104' may have any initial orientation and an alignment system provides a convenient orientation for the pattern 104' and/or for the substrate with respect to the light beam 108. For example, the pattern 104' and/or the substrate may be arbitrarily oriented and the alignment system orients the substrate in such a way that the pattern 104' is substantially perpendicular to the two-dimensional light beam 108, for example orienting the pattern 104' along the x axis of the coordinate system 160 with the two-dimensional light beam 108 oriented in the Ozy plane of the coordinate system 160.

In some embodiments a misalignment of the pattern 104' of up to ±2° with respect to an axis perpendicular to the two-dimensional light beam 108 can be compensated for by the alignment system.

The alignment system may detect a direction of the pattern 104' and orient the substrate in such a way that the pattern 104' becomes substantially perpendicular to the two-dimensional light beam 108.

Therefore, in some embodiments, the wet pattern 104' is mainly perpendicular to the two-dimensional light beam 108.

In alternative embodiments, an angle between the conductive paste 104 and the light beam 108 may be an arbitrary angle, in particular an angle greater than zero.

The y axis of the coordinate system 160 is typically vertically oriented, such that the force of gravity acts in the direction $-\vec{y}$ and the conductive paste 104 is on top of the substrate 102 with respect to the earth, i.e. with respect to gravity.

Once the light beam 108 reaches the surface of the conductive paste 104 on the substrate 102 at the incidence segment 104, the light is reflected back in one or more directions.

Some reflected light 110 from the light beam 108, reflected by the surface of the conductive paste 104 forming the wet pattern 104', passes through a lens 112 that focuses the reflected light 110 on a light detecting device 114 that is configured to detect a two-dimensional light information on a surface of the light detecting device 114. The light detecting device 114 may be a CCD sensor.

Therefore, the incidence segment 140 is detected by the light detecting device 114 based on reflected light 110 that hits the light detecting device at a detection line 180. The detection line 180 is a line also having a tangential component that extends perpendicular to the Oxy plane of FIG. 1.

The light detecting device 114 is able to detect the characteristics of the whole incidence segment 140. For example, let h(z) be the height of the conductive paste 104 at the incidence segment 140 corresponding to a point with a z-coordinate given by z. For z as given, when h(z) varies, a corresponding point on the detection segment also varies. The detection segment 180 is therefore indicative of the two-dimensional profile $$\{(z,h(z))|z \in I\}$$

of the wet conductive paste 104 along the incidence segment 140 characterized by coordinates z in a set I, for example with $I=[z_{min},z_{max}]$ describing the incidence segment 140.

The laser system 106, the lens 112 and the light detecting device 180 are included in an in-line profilometer 101 configured to extract three-dimensional morphological data of the wet pattern 104' in real-time.

The in-line profilometer is capable of repeatedly computing the two-dimensional profile {(z,h(z))|z along the incidence segment} of the wet conductive paste 104 along the incidence segment 140 while the substrate is moved parallel to the x direction. Alternatively, the in-line profilometer may be moved with respect to the substrate 102 in the x direction.

Let Ox'y'z' be a Cartesian coordinate system fixed with the substrate 102 and oriented in parallel with the Cartesian coordinate system Oxzy 160. Therefore, the x axis is parallel to the x' axis, the y axis is parallel to the y' axis and the z axis is parallel to the z' axis, but while Oxzy is fixed with respect to the in-line profilometer 101 and therefore fixed with respect to the laser system 106, the coordinate system Ox'y'z' is fixed with respect to the substrate 102 and therefore fixed with respect to the conductive paste 104 and the wet pattern 104'.

The surface of the substrate 102 and/or of the conductive paste 104 is continuously scanned while the substrate 102 is moved with respect to the in-line profilometer 101, for example with a movement parallel to the x axis.

Therefore, each point (x', z') within at least one stripe on the substrate 102 is illuminated at some time instant (while the substrate is moved with respect to the profilometer) by the light beam 108; a height h(x',z') of the conductive paste 104 in (x',z') is obtained, obtaining therefore the set $$M=\{(x',z',h(x',z'))|(x',z') \text{ on the substrate illumined at some instant}\}$$

The set M forms three-dimensional morphological data of the wet pattern 104' and therefore the in-line profilometer 101 is capable of extracting three-dimensional morphological data M of the wet pattern 104' in real-time.

A computing device 190 may be configured to extract the three-dimensional morphological data based at least in part on the light detected by the light detecting device.

The computing device 190 may further include a memory 3031 and/or a controller 3032.

The controller 3032 of the computing device 190 may be used to control the laydown of the conductive paste 104, controlling a printer 192 configured to apply the conductive paste on the substrate.

The printer 192 is only schematically shown in the figures.

An actuator 191, only schematically shown in FIG. 1, may move the substrate holder 120 and the substrate 102 with respect to the in-line profilometer 101.

Figure 2:
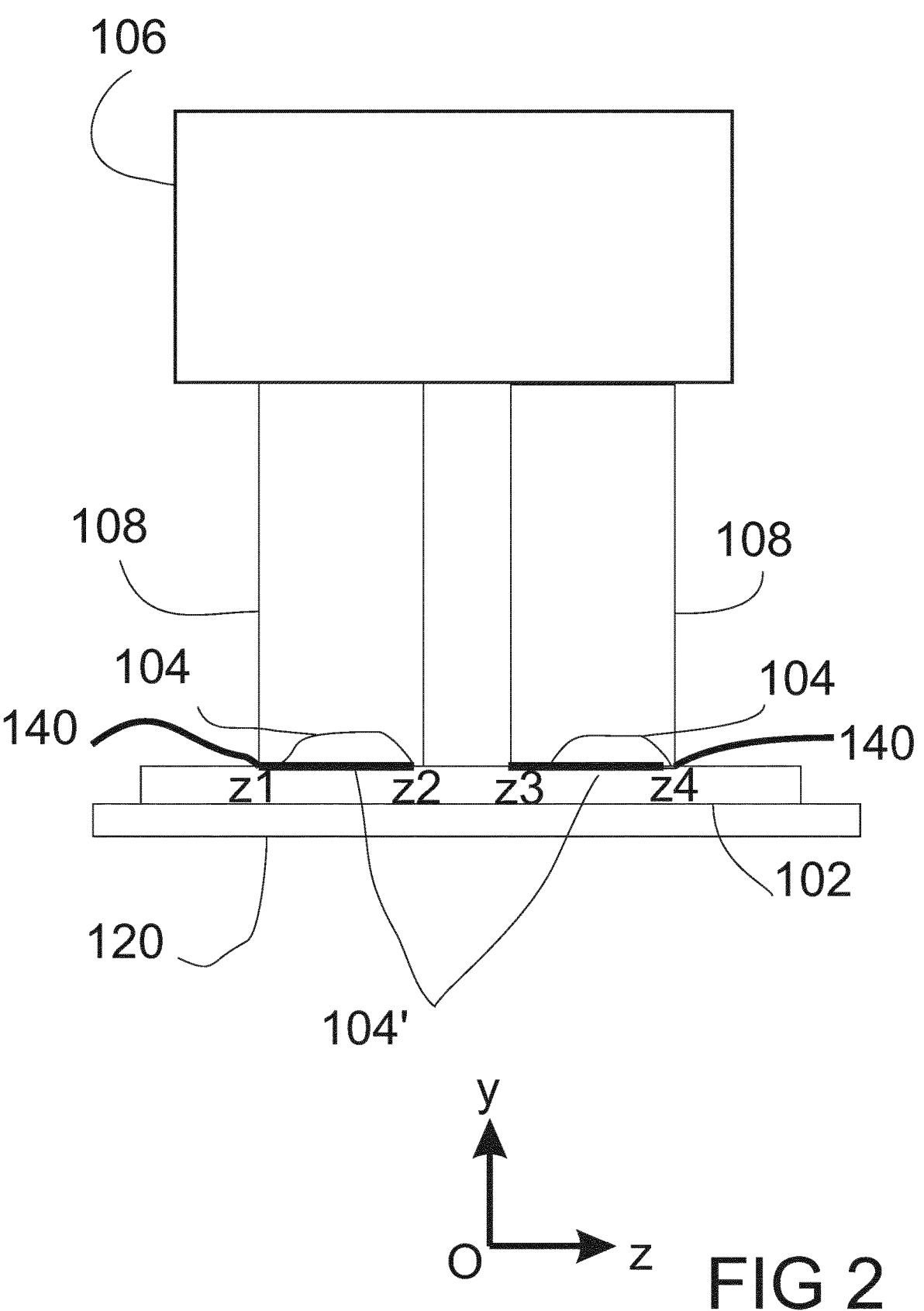
FIG. 2 shows details related to embodiments of methods and apparatuses of the present disclosure.

FIG. 2 shows further details related to embodiments of methods and apparatuses of the present disclosure.

FIG. 2 shows details in the Ozy plane of the coordinate system 160.

In particular. FIG. 2 shows details of a multiple-head in-line profilometer 101 according to some embodiments of the present disclosure.

In some embodiments, the light beam 108 emitted by the laser system 106 may be formed by two or more components illuminating respective parts of the conductive paste 104 forming the wet pattern 104'.

Therefore, in some embodiments the incidence segment 140 may be formed by the union of two or more line-segments, i.e. in these embodiments $$I=[z_1,z_2] \cup [z_3,z_4] \cup \ldots$$

with $z_1 \leq z_2 \leq z_3 \leq z_4 \leq \ldots$ and the in-line profilometer is then configured to extract the three-dimensional morphological data M based on the subset of points of the substrate illumined at some instant by the light beam while the substrate is moved with respect to the profilometer.

For example, $z_2-z_1=6$ mm and $z_4-z_3=6$ mm. Therefore, in some embodiments, the in-line profilometer 101 may allow an inline scan on two stripes with 6 mm width each for the full wafer length of the substrate 102.

The light detecting device 114 and/or the detection segment 180 allow to get information of height and/or roughness and/or width of the conductive paste 104.

The resolution of the morphological data may be for example between 1 μm and 10 μm. The substrate 102 placed on the substrate holder 120 may be advanced by a belt of the substrate holder for example with a speed of 200 mm/s, e.g. in the −x direction of FIG. 1. An actuator may be the belt together with a device for imparting a movement to said belt.

The morphological data M may allow for correlating and/or determining a volume of the conductive paste 104 forming the wet pattern 104' to the printed paste weight and therefore for computing a total mass of the printed paste and/or an area density of the printed paste for a given portion of the substrate. A flow rate of the conductive paste laydown on the substrate can be determined.

It is therefore possible to determine in real-time how much paste is applied on a given portion of the substrate and based on this determination a control of the wet paste laydown becomes possible in real-time.

Once a firing process takes place, it is not possible anymore to control the wet paste laydown, given that the fingers and/or the busbars are definitively in place. After firing, only the detection of a defect is possible. Embodiments of the present disclosure allow for controlling and/or adjusting and/or correcting the wet paste laydown in real-time and before firing, such that a real-time in-line adjustment and control of the wet paste laydown prevents the occurrence of defects in the first place improving the yield.

The in-line profilometer can detect morphology changes of the conductive paste 104.

The morphological data can be used to calculate paste laydown in agreement with off-line scale measurements.

In some embodiments, the three-dimensional morphological data M may be partitioned in blocks, with each block describing for example data of a finger and/or a bus bar wet pattern 104' formed by the conductive paste 104.

The three-dimensional morphological data is collected and stored.

The light beam 108 may form one or more scanning blades configured to scan the conductive paste 104.

The angle between the laser system 106 and the light detection device 114, e.g. a CCD camera is kept fixed. The in-line profilometer is based on a triangulation based on the reflected light 110.

The light beam 108 may in particular be blue light.

The laydown of the conductive paste 104 may be correlated with the three-dimensional morphological data.

Based on the three-dimensional morphological data and/or based on the image captured by the light detecting device 114, height, roughness and width of the wet pattern 104' formed by the conductive paste 104 may be obtained. Based on the obtained height and/or roughness and/or width, a laydown of the conductive paste 104 can be controlled, in particular to optimize a material consumption of the paste.

The method and apparatus as presented herein allow for using a minimum amount of paste while reaching quality and yield targets. The control of the laydown of the conductive paste 104 allows for a process control, in particular a real-time in-line control, to ensure an optimal and uniform paste laydown for reaching the target production quality and yield. Effects of, e.g. temperature, are compensated in real-time obtaining a uniform paste laydown for each processed wafer/substrate and also within the single wafer.

For example, knowing the paste area density on the surface of the substrate, an optimization of the amount of paste laydown can be carried out. The paste is very expensive and therefore methods of the present disclosure allow for saving material and costs.

The present disclosure overcomes the limitations of measuring the amount of paste before and after the printing process with measurements that are traditionally costly in time and/or imprecise.

The present disclosure allows for measuring drift, trend and variations of the paste laydown. If a drift is detected, a close loop control is carried out with process parameters in order to keep the paste laydown process stable.

The present disclosure allows for obtaining many more data points when compared to the low amount of data points obtained by traditional offline measurements.

Figure 3:
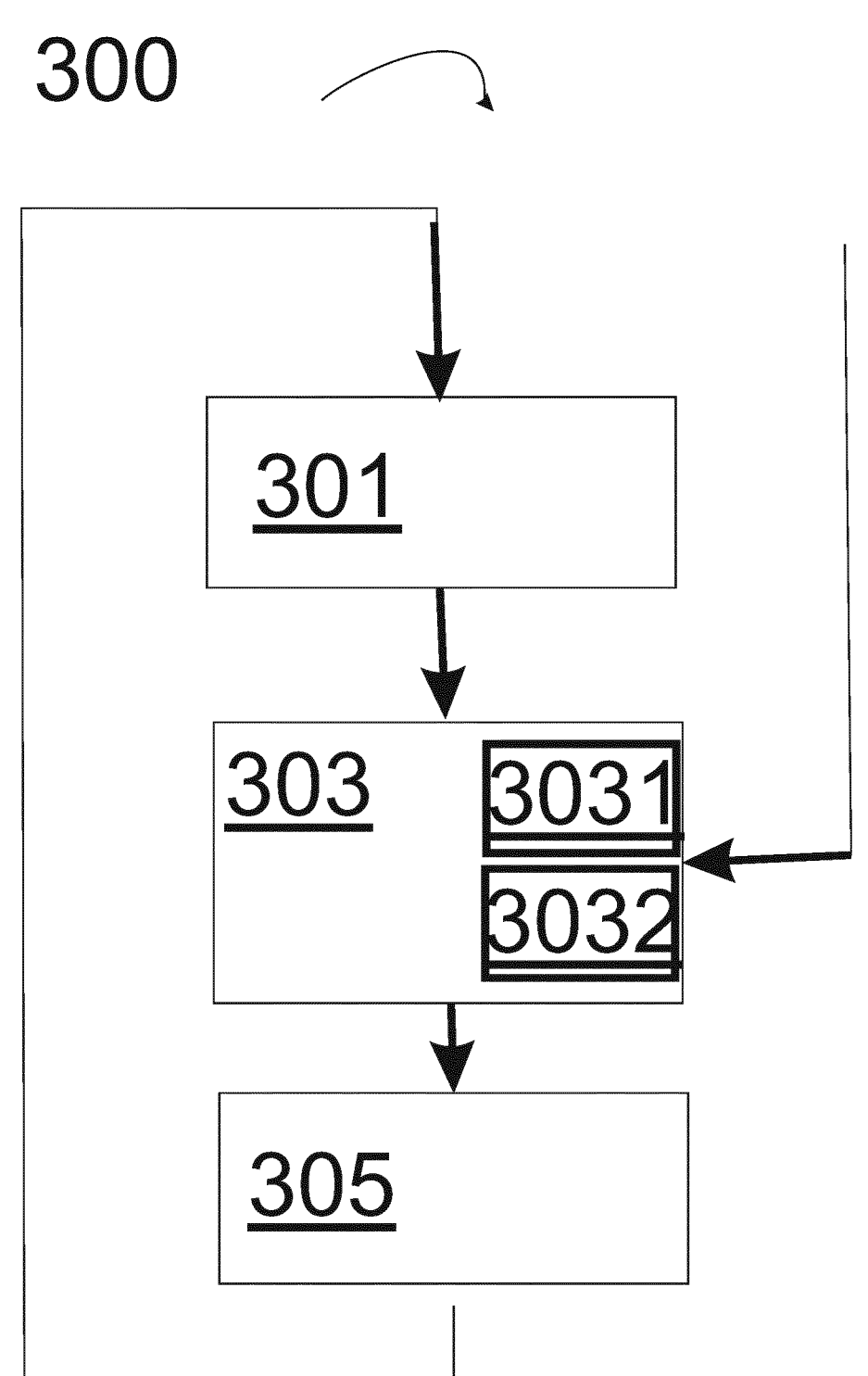
FIG. 3 shows details of embodiments of methods of the present disclosure

FIG. 3 shows details of embodiments of methods 300 of the present disclosure.

An execution may start in block 303 where a memory 3031 is read out for obtaining three-dimensional morphological data of the wet pattern (104'). The memory 3031 may not contain any data at the beginning of the execution. Then based on the data in the memory 3031, a controller 3032 is used to control at least in part a printing 305 of the wet pattern on the substrate. If the memory 3031 does not contain morphological data the printing of the wet pattern may be guided by default settings. Then the wet pattern (104-pattern) is printed 305 on the substrate, e.g. using a screen printing process. Three-dimensional morphological data is extracted 301 in real-time during or after the printing process.

The term "real-time" has to be intended such that the extraction of the morphological data happens as soon as possible after or during the printing process that may nevertheless need to be completed before meaningful three-dimensional morphological data may be obtained. Therefore, the term "real-time" does not necessarily imply that the three-dimensional morphological data is obtained while the printing process is currently carried out. The three-dimensional morphological data may be extracted as soon as the data becomes meaningful during or after the printing of the wet pattern is carried out and/or at least partially completed. The pattern is a wet pattern.

The three-dimensional morphological data, that may also include information about width and/or roughness and/or height of the wet pattern and/or of the conductive paste forming the wet pattern, may then be processed and stored in the memory 3031. The execution in block 303 may use the available and updated data in the memory 3031 as an input to the controller 3032 that may, based on the updated extracted three-dimensional morphological data, refine a control of the printing 305 process, for example adjusting an amount of conductive paste that is applied onto the substrate, or optimizing the material consumption of the conductive paste.

Figure 4:
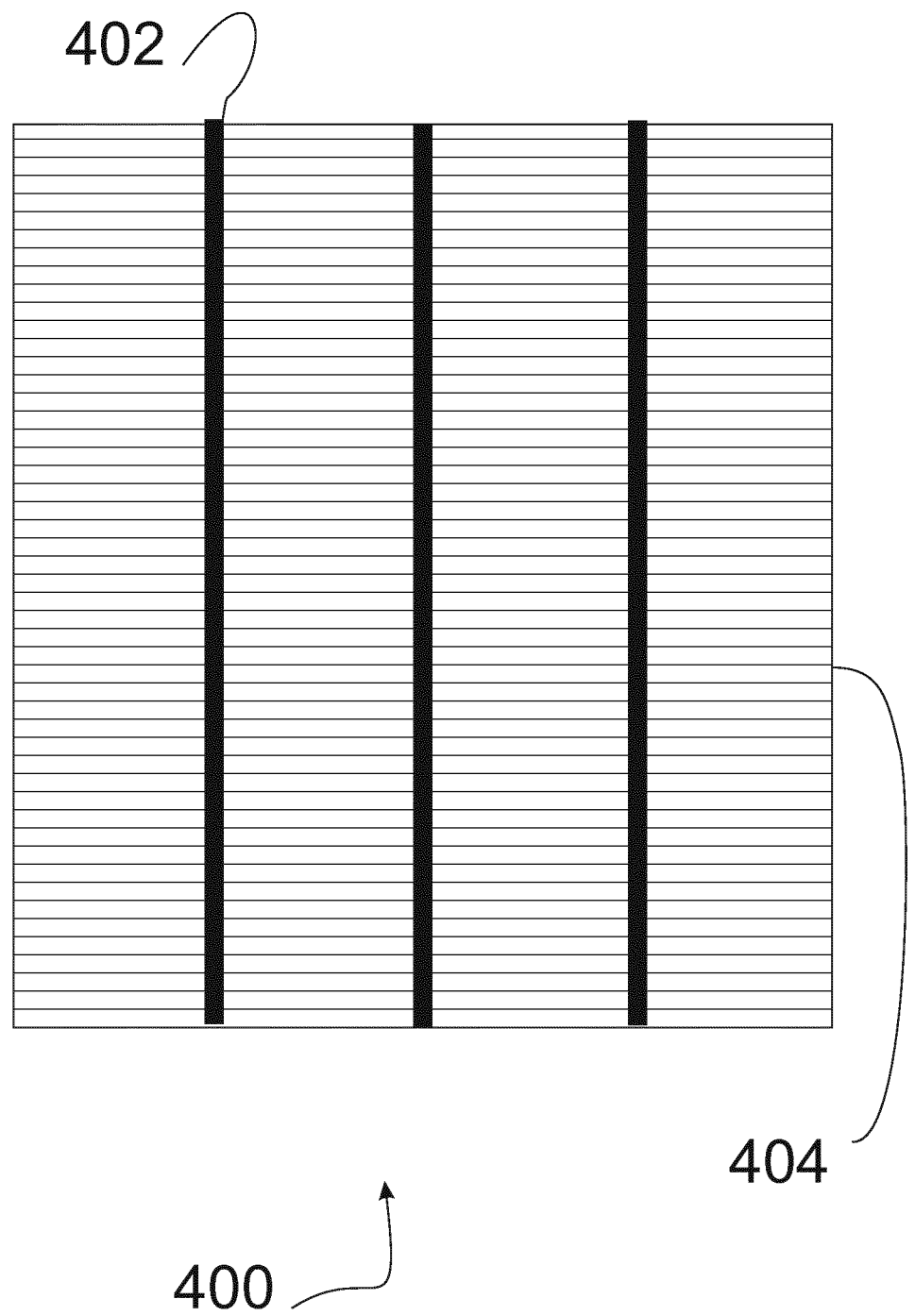
FIG. 4 shows an embodiment of a solar cell related to the present disclosure

FIG. 4 shows a solar cell related to embodiments of the present disclosure.

In particular the solar cell 400 may be characterized by fingers 404 and/or busbars 402 obtained according to methods of the present disclosure. The wet pattern 104' may be dried to form fingers 404 and/or busbars 402 of the solar cell 400.

Figure 5:
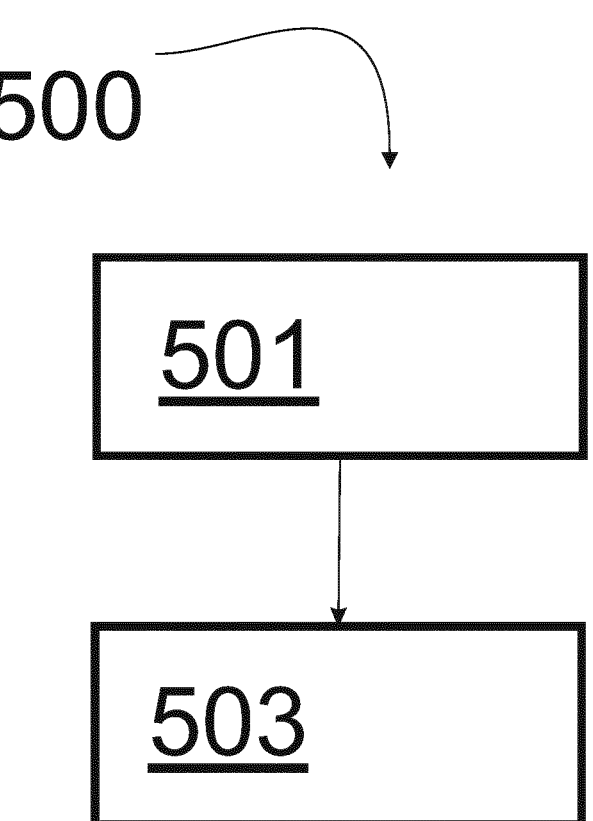
FIG. 5 shows a method for printing on a substrate for the production of a solar cell according to the present disclosure.

FIG. 5 illustrates a method 500 for printing on a substrate for the production of solar cells according to embodiments of the present disclosure. The method 500 includes printing 501 a wet pattern on the substrate, extracting 503 three-dimensional morphological data of the wet pattern in real-time using an in-line profilometer; wherein the printing of the wet pattern on the substrate is controlled in real time at least in part based on previous three-dimensional morphological data obtained by extracting the three-dimensional morphological data.

Figure 6:
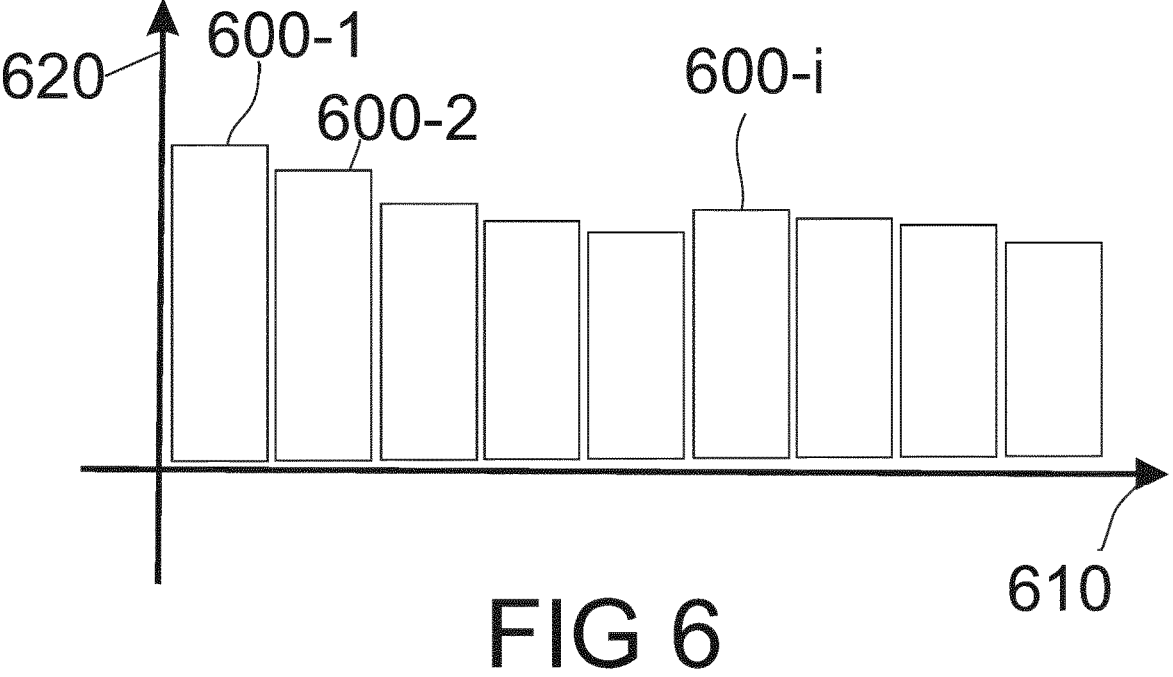
FIG. 6 shows a height of the printed wet pattern for different wafers.
Figure 7:
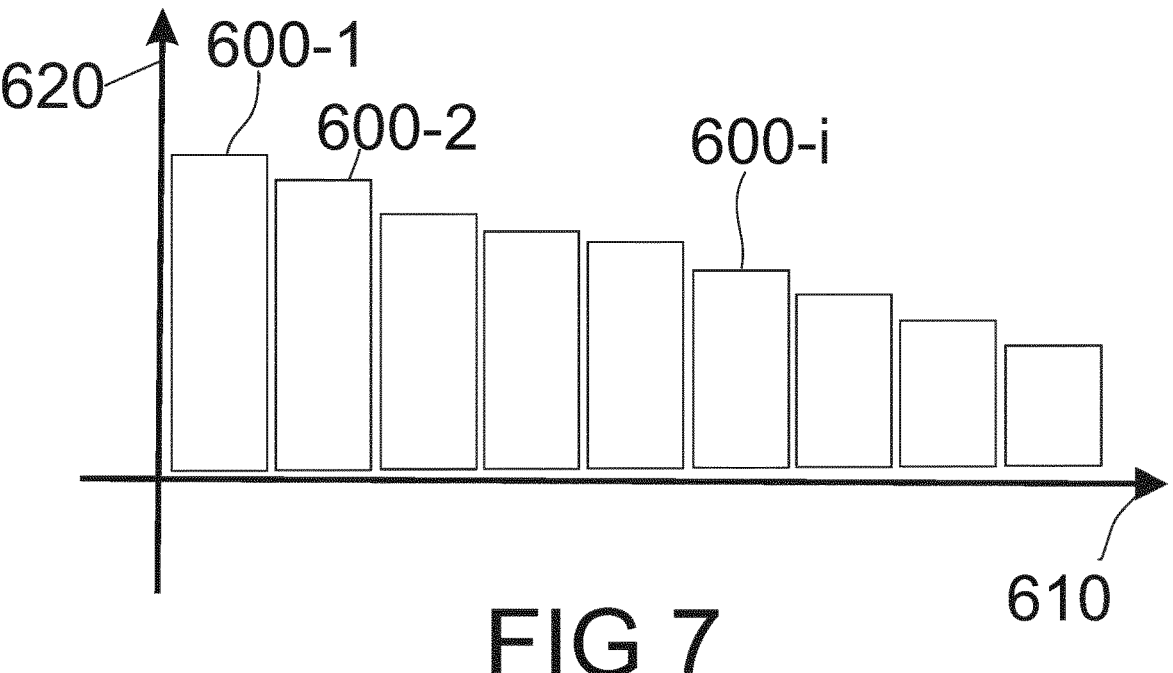
FIG. 7 shows a height of the printed wet pattern for different wafers.

FIG. 6 and FIG. 7 show a height of the printed wet pattern for different wafers.

According to embodiments of the present disclosure, a wet pattern is printed on a plurality of wafers forming a plurality of substrates.

Therefore, a conductive paste laydown occurs for each wafer/substrate of the plurality of wafers/substrates, the conductive paste applied to a wafer/substrate forming the wet pattern relative to that wafer/substrate.

A sequential printing of the wet pattern for n wafers is carried out, each resulting in an average height of the printed wet pattern for the respective wafer.

In FIG. 6 and in FIG. 7 the average height of the printed wet pattern of the i-th wafer/substrate is indicated with 600-i. Therefore 600-1 indicates the average height of the printed wet pattern for the first wafer/substrate, 600-2 indicates the average height of the printed wet pattern for the second wafer/substrate processed sequentially after the first substrate, etc. for each substrate i processed sequentially.

Therefore, the axis 610 is indicative of a time sequence, where the i-th printed wafer/substrate corresponds to the i-th position and the axis 620 is indicative of the average height.

FIG. 6 shows a fluctuation of the average height 600-i of the printed wet pattern of the i-th wafer/substrate. In particular the fluctuation may show an oscillation of the average height that may be or not be periodic or show a monotonic decrease or increase.

FIG. 7 shows a monotonic decrease of the average height 600-i of the printed wet pattern of the i-th wafer/substrate that may for example occur when progressive degradation processes occur during the printing process.

The non-constant nature of the average height 600-i may result from a plurality of causes, like for example temperature variations, disturbances, drifts and/or degradation of material.

According to solutions known so far, wafers are taken off-line to be weighed, typically to be weighed manually and/or to be weighed at the cost of time. Based on this weight and knowing the weight of the original wafer, e.g. based on a previous weight of the wafer without the wet pattern (resulting in the need to weigh twice), it is traditionally possible to determine the amount of conductive paste applied and/or the volume and/or average height of said conductive paste. Due to the time-consuming nature of this offline weighing it is not possible in prior art to determine the average height 600-i of the printed wet pattern for each wafer without an inacceptable slowdown of production. In prior art therefore, it is only possible to measure for example the average height $600\text{-}1$ of the wet pattern of the first wafer followed by a measurement of the average height $600\text{-}x$ of an x-th wafer where x is, for instance, several hundred or even thousand wafers later.

The present disclosure allows for determining the height of the conductive paste in real-time thereby allowing to determine the height of the conductive paste applied on the i-th wafer/substrate with great precision and accuracy.

The present disclosure therefore overcomes the limitation of the prior art, eliminating the need for a costly manual or offline weighing and allowing for a real-time control of the printing. Changes in the paste laydown can be tracked and reacted to by the control.

Figure 8:
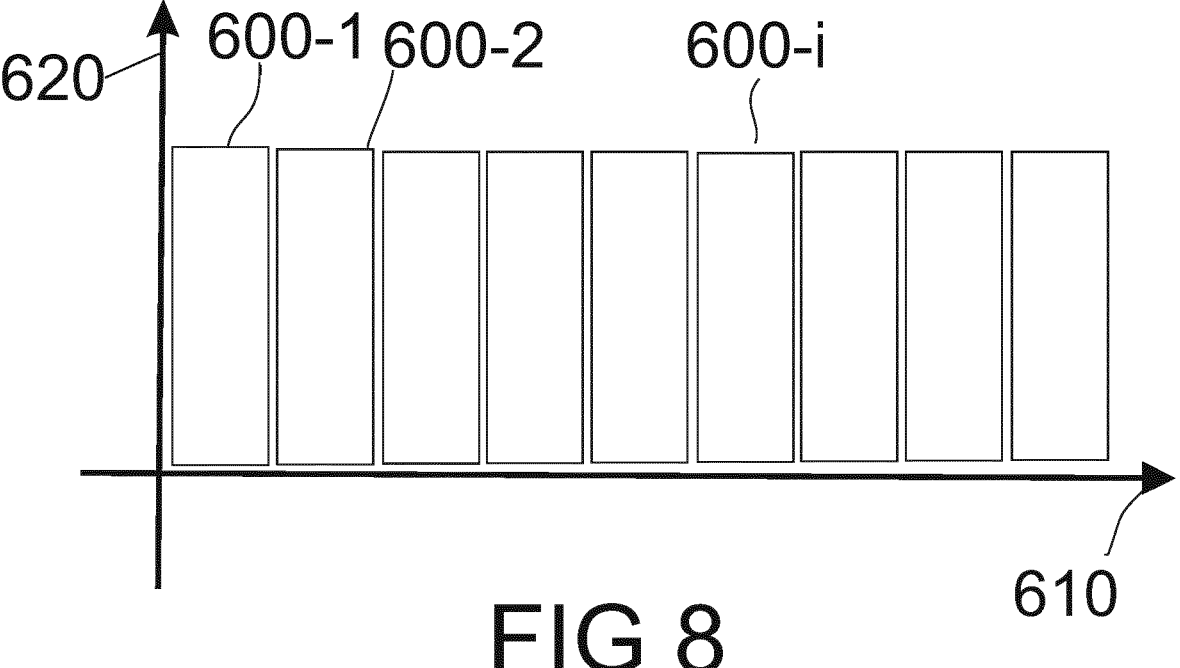
FIG. 8 shows a height of the printed wet pattern for different wafers that is provided by the present disclosure.

FIG. 8 shows a height of the printed wet pattern for different wafers as provided by the present disclosure. As illustrated the present disclosure allows for obtaining a near constant average height $600\text{-}i$ of the printed wet pattern for all the wafers whereas such a constant height cannot be obtained with prior art teachings. The real-time and in-line control that the present disclosure provides prevents or compensates for variations in the height of the conductive paste in particular due to degradation processes, temperature drifting, consumption of used materials (e.g. of the printing screen), etc.

Figure 9:
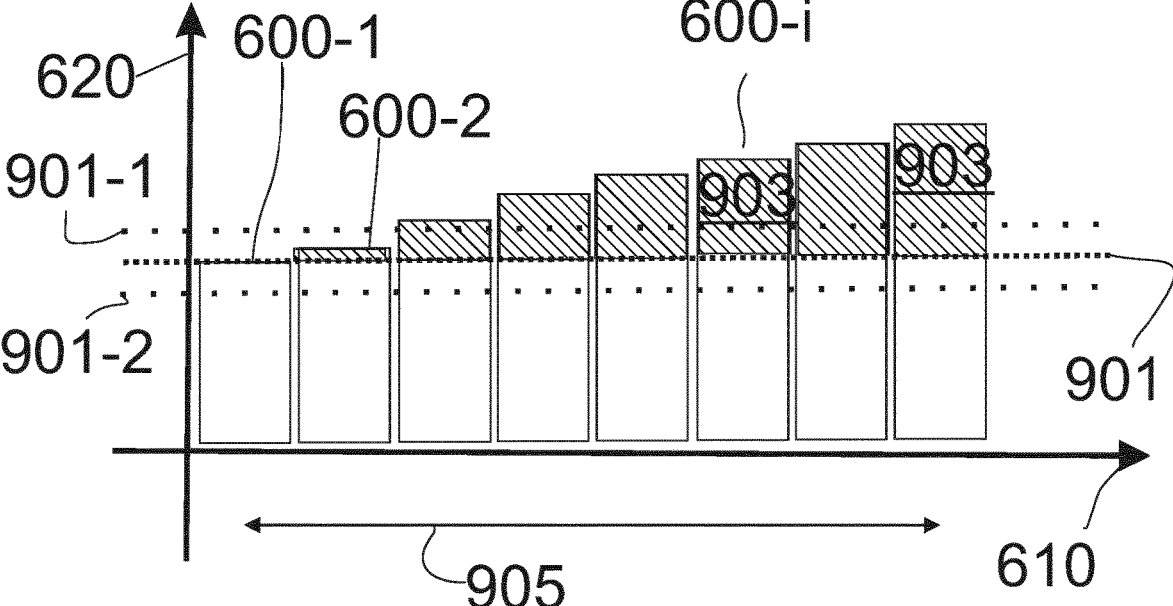
FIG. 9 shows an example of a height of a printed wet pattern obtained using state of the art methods.

FIG. 9 shows an example of a height of a printed wet pattern obtained using state of the art methods.

When a sequence of wafers is processed according to prior art methods, the average height $600\text{-}i$ of the printed wet pattern of the i-th processed wafer/substrate in the sequence may drift and/or oscillate. FIG. 9 shows exemplarily a drift that produces an increased height of the wet pattern, i.e. for a wafer j processed after a wafer i (i.e. for j>i), the average height $600\text{-}j$ of the printed wet pattern of the j-th wafer is greater than or equal to the average height $600\text{-}i$ of the printed wet pattern of the i-th wafer, at least on average.

A target height 901 of the printed wet pattern should ideally be obtained resulting in an optimal target weight of the paste for the wafer and avoiding a waste of paste while providing the desired yield and quality.

In the example, the drift of the height of the wet pattern produces wafers for which the paste laydown increases and as a result the average height of the printed wet pattern increases over the wafer sequence resulting in an increasing excess amount 903 of paste that is wasted.

The excess height for the i-th wafer, defined as the average height $600\text{-}i$ of the printed wet pattern of the i-th wafer minus the target height 901 corresponds to an excess amount 903 of paste that is unnecessarily applied and therefore wasted.

In the example, an excess amount 903 of paste increases significantly over time for different wafers resulting in a significant cumulative wasting of paste.

In the state of the art, a measurement of the height of the printed wet pattern and/or of the amount of paste is only possible at great time intervals 905 that are typically of many hours, e.g. 4 hours or more, taking a wafer offline to measure the height of the wet pattern of the wafer by weighing.

In the example, only the first and last wafer in the sequence can be weighted (resulting in a double weighing at the beginning and the end of the sequence). Therefore, in prior art a measurement of the amount of paste and/or of the height of the wet pattern only occurs at the beginning and at the end of the time interval 905 that is typically of many hours while the intermediate wafers cannot be weighed without an unacceptable consumption of time during production.

In FIG. 9, an upper bound 901-1 and a lower bound 901-2 are indicated which may correspond to a tolerance to a deviation from the target height 901. A measurement that is carried out at great time intervals may only detect a height outside the tolerance, i.e. above the upper bound 901-1 or below the lower bound 901-2, after many hours when for example the excess amount of paste is already significant, i.e. when the height $600\text{-}i$ of the printed wet pattern significantly exceeds the upper bound 901-1 or is significantly below the lower bound 901-2.

The target height 901 corresponds to a target weight defined as the amount of silver paste for optimal cell efficiency with minimum usage of paste. Said amount is determined prior to production typically in combination with a tolerance resulting in the upper bound 901-1 and the lower bound 901-2.

If the paste laydown for a cell is greater than the target weight, like in the example, then the cell efficiency is ensured but the paste consumption is greater than the baseline and a higher cost is unnecessarily incurred.

Conversely, if the paste laydown is lower than the target weight, then the cell efficiency is lower than the baseline and a "scrap cell" is obtained reducing the yield.

According to prior art, at the beginning of the time interval 905 an operator starts the machine in nominal condition and after the time interval 905 has elapsed, typically after many hours, e.g. after 4 hours, the operator weighs the cell again determining an excess amount of paste or a missing amount of paste. For this double weighing the cell is typically taken offline. If the operator finds that the laydown is out of the required tolerance, he manually adjusts the laydown by changing print parameters or changing a consumable, like the printing screen. The operator knows the amount of paste that is calculated in advance and is able to perform the adjustment.

Figure 10:
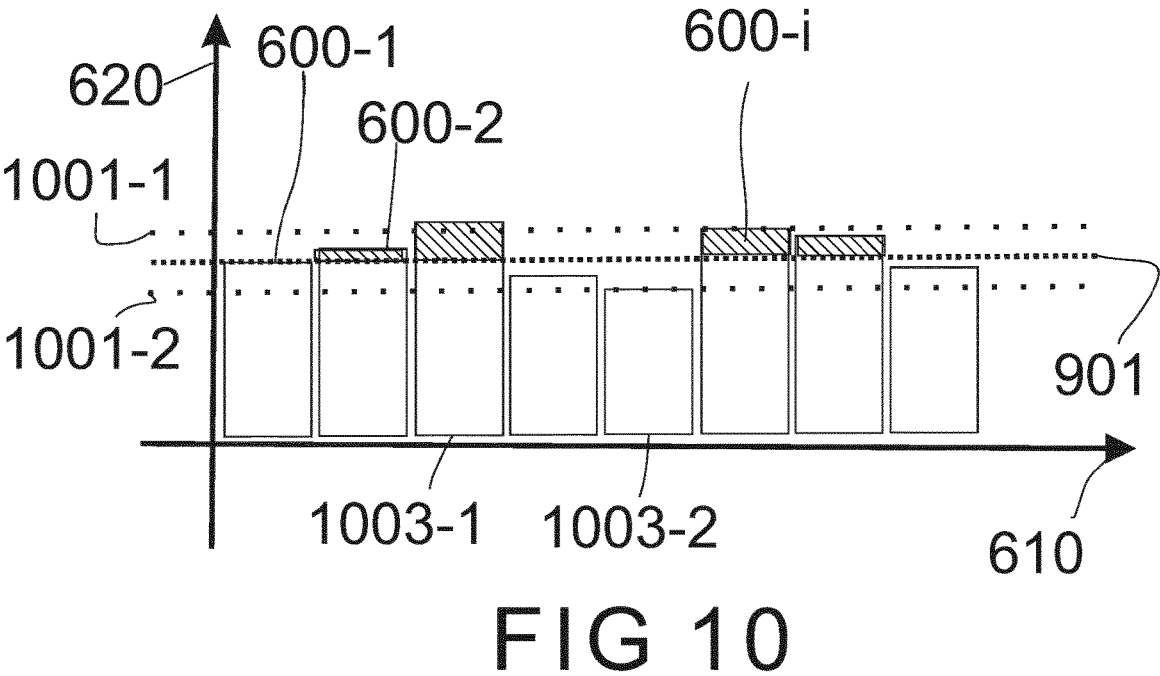
FIG. 10 shows an example of a height of a printed wet pattern obtained according to embodiments of the present disclosure.

FIG. 10 shows an example of a height of a printed wet pattern obtained according to embodiments of the present disclosure.

According to an embodiment, exemplarily illustrated in the figure, the average height $600\text{-}i$ of the printed wet pattern of the i-th wafer is determined in real-time and a manual operator receives information of any deviation outside the bounds determined by the tolerance.

If the height/laydown goes out of tolerance, for example exceeding an upper bound 1001-1 as is the case for the wafer 1003-1, embodiments of the present disclosure allow for a detection of the deviation. An alarm is sent to the controller and the production can be stopped to adjust the paste laydown.

For example, the operator checks the reason for the deviation, e.g. degradation, and restores the nominal conditions changing parameters. The parameters are adjusted such that the target height 901 is met again. Silver paste is therefore not wasted anymore given that a deviation outside the tolerance bounds is immediately detected and not only after many hours.

For example, for the wafer 1003-2 the laydown, i.e. the height of the printed wet pattern goes below the target height 901 going below a lower bound 1001-2. Embodiments of the present disclosure detect the deviation and send an alarm. The operator sets up the exact target weight again to overcome the deviation by manually adjusting the parameters.

The width of the interval fixed by the lower bound 1001-2 and the upper bound 1001-1, i.e. the height of the upper bound 1001-1 minus the height of the lower bound 1001-2 is significantly smaller than the difference between upper bound 901-1 and lower bound 901-2 in prior art due to the possibility of real-time detection.

In particular the lower bound 1001-2 allows for avoiding that the average height **600-*i*** of the printed wet pattern is low to such an extent as to produce a scrapped cell.

The weight estimation/measurement in real time for each cell allows for controlling the process with minimal intervention of an operator, avoiding scrap cells and preventing a waste of paste.

Figure 11:
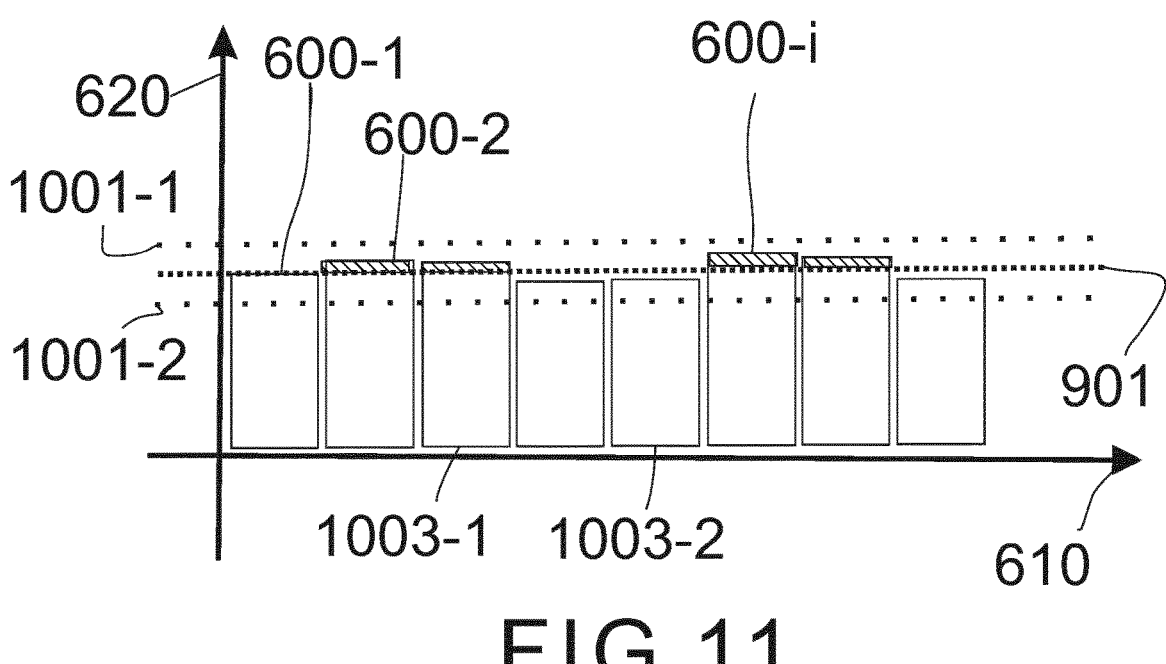
FIG. 11 shows an example of a height of a printed wet pattern obtained according to embodiments of the present disclosure.

FIG. 11 shows an example of a height of a printed wet pattern obtained according to embodiments of the present disclosure.

According to some embodiments of the present disclosure, the paste laydown is controlled with an automatic closed-loop control system, thereby avoiding the need of returning to a human operator.

Embodiments of the present disclosure automatically control the paste laydown with a closed-loop. If the height of the paste increases above the target height 901 or decreases below the target height 901, the automatic control may adjust the paste laydown in real-time to minimize any deviation from the target. In such a way the height of the wet pattern approaches a constant level corresponding to the target height 901 and only a very small error may be present, for example with the height tightly oscillating around the target.

It is also possible to forecast changes in a consumable, like the used screen and to preventively intervene, e.g. with an accurate preventive maintenance related to the consumable.

The maintenance can, for example, be carried out by an operator at the earliest adequate moment in time to optimize cost and material consumption, as a consequence of the real-time nature of extracting 503 three-dimensional morphological data of the wet pattern in real-time using an in-line profilometer.

The real-time control allows to further reduce the tolerance and to set the upper and lower bounds closer to the target level providing a near constant amount of paste laydown when compared to prior art.

Further to the previous description, the present disclosure is directed at in-line profilometers to extract three-dimensional morphological data of a dried pattern and/or of a fired metal contact obtained from firing the wet pattern.

According to alternative embodiments the morphological data may be morphological data of a dried pattern and/or of a fired metal contact forming a busbar and/or a finger of a solar cell.

In some embodiments, the cell may be taken off-line for being scanned by the profilometer.

The profilometer may be alternatively based on interferometry with different focals and/or filters and/or projections of structured beams. In some embodiments, confocal profiling may be used.

In the following embodiments of the present disclosure are described in detail.

Some embodiments disclose a method 500 for printing on a substrate for the production of a solar cell, the method comprising:
printing 501 a wet pattern on the substrate 102;
extracting 503 three-dimensional morphological data of the wet pattern in real-time using an in-line profilometer;

wherein the printing of the wet pattern on the substrate is controlled in real time at least in part based on previous three-dimensional morphological data obtained by extracting the three-dimensional morphological data.

In some embodiments, the morphological data includes the height of the printed wet pattern at least in part dependent on a two-dimensional position relative to the substrate (for example as a function of said position) and/or wherein the morphological data further allows for determining a thickness and/or a width and/or volume and/or roughness data of the printed wet pattern and wherein the printing of the wet pattern on the substrate is controlled in real time based at least in part on the determined height and/or thickness and/or width and/or volume and/or roughness data of the printed wet pattern.

In some embodiments, printing the wet pattern includes a conductive paste laydown on the substrate and an extraction of the three-dimensional morphological data allows for determining, in real-time, the quantity of the conductive paste on the substrate and/or a flow rate of the conductive paste laydown on the substrate; and the conductive paste laydown is controlled in real time and/or adjusted in real time based on the determined quantity and/or flow rate.

In some embodiments, the morphological data comprises a height for each point at least within a rectangular stripe scanned by the in-line profilometer with respect to the substrate.

In some embodiments, the morphology data comprises a height for each point within two rectangular stipes scanned by the in-line profilometer with respect to the substrate, in particular the in-line profilometer is a multiple-head profilometer.

In some embodiments, the substrate moves with respect to the in-line profilometer along a first direction; and the in-line profilometer is a 3D laser profilometer shining a light on the substrate that illuminates the substrate along a substantially linear segment or the union of substantially linear segments extending in a direction that is substantially perpendicular to the first direction.

In some embodiments, the 3D laser profilometer shines a blue light, and the three-dimensional morphological data is obtained based on the reflection of said blue light on the wet pattern on the substrate, in particular the blue light has a wavelength, such as of 405 nm.

In some embodiments, the wavelength may be determined or adjusted in function of the substrate, for example in order to maximize the reflection of the light. Therefore, the wavelength may be dependent on the used substrate as to be in a range of light actually reflected by the substrate with adequate intensity. Wafers with different colors, i.e. reflecting different wavelengths, may need a different wavelength to that of the incident light shined by the 3D laser profilometer to maximize the light reflected by the substrate In some embodiments, the wet pattern is a wet pattern of a finger and/or of a busbar of the solar cell.

Some embodiments disclose a method for optimization of material consumption during production of a solar cell, the method comprising:
printing on a substrate 102 for the production of the solar cell according to the methods of the present disclosure;
determining a material consumption based on the extracted three-dimensional morphological data;
optimizing the material consumption;
wherein the material consumption is a consumption of a material used for printing the wet pattern on the substrate;

Some embodiments describe an apparatus for printing on a substrate 102 for the production of a solar cell, the apparatus comprising:

a substrate holder 120;

an in-line profilometer 101;

an actuator 191 coupled to the substrate holder 120;

a printer 192 for applying a wet pattern on the substrate 102;

a controller coupled to the in-line profilometer and the actuator and the printer and configured to control a printing of the wet pattern on the substrate.

wherein the in-line profilometer 101 is configured to extract three-dimensional morphological data in real-time of the wet pattern on the substrate 102 placed on the substrate holder;

In some embodiments, the in-line profilometer 101 includes:

a laser system 106 configured to generate a two-dimensional light beam 108 incident on the wet pattern on at least one incidence segment 140;

and/or a light detecting device 114 configured to detect two-dimensional light information;

and/or a lens 112 system configured to capture light reflected from the wet pattern at the at least one incidence segment and/or to direct the reflected light (110) to the light detecting device 114 such that two-dimensional reflected light information is detected by the light detecting device 114;

and/or a computing device 190 configured to extract the three-dimensional morphological data based at least in part on the light detected by the light detecting device.

In some embodiments, the actuator coupled to the substrate holder is a linear actuator or a conveyor configured to linearly move the substrate in a direction that is substantially perpendicular to the at least one incidence segment.

In some embodiments, the light beam is formed by blue light, in particular with a wavelength of 405 nm.

In some embodiments, the printer 192 and the controller are configured to print the wet pattern based on three-dimensional morphological data previously extracted by the in-line profilometer 101.

In some embodiments, the morphological data includes the height of the wet pattern at least in part in function of a two-dimensional position relative to the substrate, and/or the morphological data further allows to determine a width and/or roughness of the wet pattern and the controller controls the printing of the wet pattern in real time based at least in part on the height and/or the width and/or the roughness of the wet pattern.

In some embodiments, the morphological data comprises a height for each point at least within a rectangular stripe scanned by the in-line profilometer with respect to the substrate.

In some embodiments, the morphological data comprises a height for each point within two rectangular stripes scanned by the in-line profilometer with respect to the substrate, in particular wherein the in-line profilometer is a multiple-head profilometer.

A pattern is made of conductive paste having a predefined geometry, e.g. a wet conductive paste or a dried conductive paste and, once fired, forms a finger and/or busbar metal contact of the solar cell according to said predefined geometry. A wet pattern is formed by the wet paste; a dried pattern is formed by the dried paste; and the finger or busbar metal contact is formed from the pattern after firing. We may define the metal contact as a fired pattern.

Even further embodiments are described in the following.

Some embodiments describe a method 500 for printing on a substrate for the production of a solar cell, the method comprising:

printing 501 a wet pattern 104' on the substrate 102, the wet pattern formed by a wet conductive paste;

drying the wet pattern to obtain a dried pattern and firing the substrate with the dried pattern to obtain a finger and/or busbar metal contact on the substrate;

extracting 503 three-dimensional morphological data of the wet pattern 104' and/or of the dried pattern and/or of the finger and/or busbar metal contact using a profilometer 101;

In some embodiments, the profilometer is an in-line profilometer.

In some embodiments, the substrate is taken off-line before the three-dimensional morphological data is extracted.

In some embodiments, the profilometer is a laser profilometer based on optical triangulation.

In some embodiments, the profilometer is based on interferometry and/or on confocal profiling.

In some embodiments, three-dimensional morphological data of the dried pattern and/or of the finger and/or busbar metal contact is extracted with a stylus profilometer In some embodiments, the morphological data includes the height of the printed wet pattern and/or of the dried pattern and/or of the finger and/or busbar metal contact at least in part in function of a two-dimensional position relative to the substrate and/or the morphological data further allows to determine a width and/or roughness data of the printed wet pattern and/or of the dried pattern and/or of the finger and/or busbar metal contact.

In some embodiments, the morphological data further contains information on roughness and/or width and/or height of the conductive paste and/or the wet pattern, obtained for example based on the light detected by the light detection device, e.g. a CCD camera, and/or obtained by data processing algorithms based in particular on the light detected by the light detecting device 114 and/or the position of the detection segment 180.

In some embodiments, the printing of the wet pattern on the substrate is controlled at least in part based on previous three-dimensional morphological data obtained by extracting the three-dimensional morphological data.

In some embodiments, the morphological data comprises a height for each point at least within a rectangular stripe scanned by the profilometer with respect to the substrate.

In some embodiments, the morphology data comprises a height for each point within two rectangular stipes scanned by the profilometer with respect to the substrate, in particular the profilometer is a multiple-head laser profilometer based on optical triangulation.

In some embodiments, the substrate moves with respect to the profilometer along a first direction; and wherein the profilometer is a 3D laser profilometer shining a light on the substrate that illuminates the substrate along a substantially linear segment or the union of substantially linear segments extending in a direction that is substantially perpendicular to the first direction.

In some embodiments, a 3D laser profilometer shines a blue light, for example of 405 nm, and the three-dimensional morphological data is obtained based on the reflection of said blue light on the wet pattern and/or on the dried pattern and/or on the finger and/or on the busbar metal contact on the substrate.

In some embodiments, printing the wet pattern includes a laydown of the conductive paste on the substrate and extracting the three-dimensional morphological data includes extracting in real-time the three-dimensional morphological data of the wet pattern and allows to determine in real-time a quantity and/or an area density of the conductive paste on the surface of the substrate and/or to determine a flow rate of the conductive paste laydown on the substrate. The conductive paste laydown is controlled and/or adjusted based on the determined quantity of the conductive paste on the substrate and/or based on the area density of the conductive paste on the surface of the substrate and/or based on the flow rate of the conductive paste laydown on the substrate.

In some embodiments, the wet pattern is a wet pattern of a finger and/or of a busbar of the solar cell.

Some embodiments of the present disclosure describe a method for optimization of material consumption during production of a solar cell, the method comprising:

Printing on a substrate for the production of the solar cell according to methods of the present disclosure;

determining a material consumption based on the extracted three-dimensional morphological data;

optimizing the material consumption;

wherein the material consumption is a consumption of a material used for printing the wet pattern on the substrate;

Some embodiments of the present disclosure describe an apparatus for printing on a substrate 102 for the production of a solar cell, the apparatus comprising a substrate holder 120;

an in-line profilometer 101;

an actuator coupled to the substrate holder;

a printer (192) for applying a wet pattern on the substrate;

wherein the in-line profilometer 101 is configured to extract three-dimensional morphological data in real-time of the wet pattern 104' on the substrate 102 placed on the substrate holder.

The solar cell is scanned by the profilometer in a broad area, for example the full cell area. Either the cell is moved with respect to the profilometer or the profilometer is moved with respect to the cell. The cell may be removed from the normal flow. The cell may be still kept in-line In some embodiments, the in-line profilometer 101 comprises:

a laser system 106 configured to generate a two-dimensional light beam 108 incident on the wet pattern 104' on at least one incidence segment 140;

and/or a light detecting device 114 configured to detect two-dimensional light information;

and/or a lens 112 system configured to capture light reflected from the wet pattern at the at least one incidence segment and/or to direct the reflected light 110 to the light detecting device 114 such that two-dimensional reflected light information is detected by the light detecting device 114;

and/or a computing device configured to extract the three-dimensional morphological data based at least in part on the light detected by the light detecting device.

In some embodiments, the actuator coupled to the substrate holder is a linear actuator or a conveyor or a belt configured to linearly move the substrate in a direction that is substantially perpendicular to the at least one incidence segment.

In some embodiments, the light beam is formed by blue light.

In some embodiments, a printer 192 or paste laydown apparatus is configured to print the wet pattern based on the three-dimensional morphological data previously extracted by the in-line profilometer 101.

The printer may be controlled by a controller 3032 receiving the three-dimensional morphological data that may be stored in a memory 3031. The memory 3031 and/or the controller 3032 may be part of a computing device 190 coupled to the light detecting device 114. The computing device 190 coupled to the light detecting device 114 may obtain the three-dimensional morphological data, store the three-dimensional morphological data in the memory 3031 and control the controller 3032 and the printer 192, in particular controlling an amount of conductive paste 104 that is applied onto the substrate 102 to form the wet pattern 104'.

The computing device 190, the memory 3031 and the controller 3032 are part of the in-line profilometer 101.

In some embodiments, the morphological data includes the height of the wet pattern at least in part dependent on a two-dimensional position relative to the substrate, and/or the morphological data further allows for determining a width and/or roughness of the printed wet pattern. For example, the height of the wet pattern may be a function of the two-dimensional position/location relative to the substrate.

In some embodiments, the morphological data comprises a height for each point at least within a rectangular stripe scanned by the in-line profilometer with respect to the substrate.

In some embodiments, the morphological data comprises a height for each point within two rectangular stripes scanned by the in-line profilometer with respect to the substrate, in particular the in-line profilometer is a multiple-head profilometer.

The invention claimed is:

1. A method for optimization of material consumption during a production of a solar cell, the method comprising:

printing a wet pattern on the substrate;

extracting three-dimensional morphological data of the wet pattern in real-time using an in-line profilometer, wherein the three-dimensional morphological data comprises at least one of a thickness, a width, a volume, a roughness, a height, or combinations thereof;

determining a material consumption based on the extracted three-dimensional morphological data;

optimizing the material consumption, wherein the material consumption is a consumption of a material used for printing the wet pattern on the substrate; and controlling the height of the wet pattern on the substrate in real time at least in part based on previous three-dimensional morphological data obtained by extracting the three-dimensional morphological data and controlling the height of the wet pattern on the substrate by controlling an amount of the material that is applied onto the substrate to form the wet pattern, wherein the real-time control compensates for variations in the height of the material due to at least one of degradation processes, temperature drifting, and consumption of used materials.

2. The method of claim 1, wherein the three-dimensional morphological data includes the height of the wet pattern at least in part dependent on a two-dimensional position relative to the substrate.

3. The method of claim 1, wherein printing the wet pattern includes a conductive paste laydown on the substrate and extracting the three-dimensional morphological data allows for determining in real-time a quantity of a conductive paste on the substrate or a flow rate of the conductive paste laydown on the substrate; and wherein the conductive paste laydown is controlled in real time or adjusted in real time based on a determined quantity or a flow rate.

4. The method of claim 1, wherein the three-dimensional morphological data comprises the height for each point at least within a rectangular stripe scanned by the in-line profilometer with respect to the substrate.

5. The method of claim 4, wherein the three-dimensional morphological data comprises the height for each point within two rectangular stipes scanned by the in-line profilometer with respect to the substrate.

6. The method of claim 1, wherein the substrate moves with respect to the in-line profilometer along a first direction and wherein the in-line profilometer is a 3D laser profilometer shining a light on the substrate that illuminates the substrate along a substantially linear segment or a union of substantially linear segments extending in a direction that is substantially perpendicular to the first direction.

7. The method of claim 6, wherein the 3D laser profilometer shines a light with predetermined wavelength, and wherein the three-dimensional morphological data is obtained based on a reflection of said light on the wet pattern on the substrate.

8. The method of claim 1, wherein the wet pattern is of a finger or of a busbar of the solar cell.

9. A method for optimization of material consumption during production of a solar cell, the method comprising:
  printing on a substrate for the production of the solar cell according to the method of claim 1;
  determining a material consumption based on the extracted three-dimensional morphological data; and
  optimizing the material consumption,
  wherein the material consumption is a consumption of a material used for printing the wet pattern on the substrate.

10. An apparatus for optimization of material consumption during printing on a substrate for a production of a solar cell, the apparatus comprising:
  a substrate holder;
    an in-line profilometer configured to extract three-dimensional morphological data of a wet pattern on the substrate placed on the substrate holder in real-time, wherein the three-dimensional morphological data comprises at least one of a thickness, a width, a volume, a roughness, a height, or combinations thereof;
    an actuator coupled to the substrate holder;
    a printer for applying the wet pattern on the substrate; and
    a controller coupled to the in-line profilometer, the actuator, and the printer, the controller is configured to optimize the material consumption, wherein the material consumption is a consumption of a material used for printing the wet pattern on the substrate, and control in real time a printing the height of the wet pattern on the substrate, the height of the wet pattern on the substrate being at least in part based on previous three-dimensional morphological data and wherein the real-time control compensates for variations in the height of the material due to at least one of degradation processes, temperature drifting, and consumption of used materials,
  wherein the in-line profilometer is configured to extract three-dimensional morphological data of the wet pattern on the substrate placed on the substrate holder in real-time.

11. The apparatus of claim 10, wherein the in-line profilometer comprises one or more of:
  a laser system configured to generate a two-dimensional light beam incident on the wet pattern on at least one incidence segment;
  a light detecting device configured to detect two-dimensional light information;
  a lens system configured to capture light reflected from the wet pattern at the at least one incidence segment or to direct the reflected light to the light detecting device such that two-dimensional reflected light information is detected by the light detecting device; and
  a computing device configured to extract the three-dimensional morphological data based at least in part on the light detected by the light detecting device.

12. The apparatus of claim 11, wherein the actuator coupled to the substrate holder is a linear actuator or a conveyor configured to linearly move the substrate in a direction that is substantially perpendicular to the at least one incidence segment.

13. The apparatus of claim 11, wherein the two-dimensional light beam is formed by blue light with a wavelength of 405 nm.

14. The apparatus of claim 10, wherein the three-dimensional morphological data includes the height of the wet pattern at least in part dependent on a two-dimensional position relative to the substrate.

15. The apparatus claim 10, wherein the three-dimensional morphological data comprises the height for each point at least within a rectangular stripe scanned by the in-line profilometer with respect to the substrate.

16. The apparatus of claim 15, wherein the three-dimensional morphological data comprises the height for each point within two rectangular stripes scanned by the in-line profilometer with respect to the substrate.

17. The method of claim 7, wherein the light is a blue light with a wavelength of 405 nm or where the wavelength of the light is adjusted based on the substrate to maximize a reflection of the light by the substrate.

18. The method of claim 5, wherein the in-line profilometer is a multiple-head profilometer.

19. The apparatus of claim 16, wherein the in-line profilometer is a multiple-head profilometer.

* * * * *